US007969767B2

(12) United States Patent
Li et al.

(10) Patent No.: US 7,969,767 B2
(45) Date of Patent: Jun. 28, 2011

(54) SPIN TRANSFER TORQUE—MAGNETIC TUNNEL JUNCTION DEVICE AND METHOD OF OPERATION

(75) Inventors: Xia Li, San Diego, CA (US); Kangho Lee, San Diego, CA (US); Xiaochun Zhu, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 189 days.

(21) Appl. No.: 12/474,608

(22) Filed: May 29, 2009

(65) Prior Publication Data

US 2010/0302843 A1 Dec. 2, 2010

(51) Int. Cl.
G11C 11/00 (2006.01)
G11C 11/14 (2006.01)
G11C 11/15 (2006.01)
(52) U.S. Cl. .................. 365/158; 365/171; 365/173
(58) Field of Classification Search .................. 365/158, 365/171, 173
See application file for complete search history.

(56) References Cited

U.S. PATENT DOCUMENTS

| 2006/0083054 | A1 | 4/2006 | Jeong |  |
|---|---|---|---|---|
| 2008/0310219 | A1* | 12/2008 | Chen et al. | 365/173 |
| 2009/0096043 | A1* | 4/2009 | Min et al. | 257/421 |
| 2010/0014347 | A1* | 1/2010 | Wang et al. | 365/171 |
| 2010/0039136 | A1* | 2/2010 | Chua-Eoan et al. | 326/38 |
| 2010/0091546 | A1* | 4/2010 | Liu et al. | 365/97 |
| 2010/0097852 | A1* | 4/2010 | Chen et al. | 365/171 |
| 2010/0110756 | A1* | 5/2010 | Khoury et al. | 365/148 |
| 2010/0124106 | A1* | 5/2010 | Kim et al. | 365/171 |
| 2010/0177554 | A1* | 7/2010 | Lu et al. | 365/148 |
| 2010/0259976 | A1* | 10/2010 | Abedifard | 365/171 |
| 2010/0261295 | A1* | 10/2010 | Horng et al. | 438/3 |

FOREIGN PATENT DOCUMENTS

| WO | 2008010957 | 1/2008 |
|---|---|---|
| WO | WO2008010957 | 1/2008 |

OTHER PUBLICATIONS

International Search Report—PCT/US2010/036645, International Search Authority—European Patent Office Aug. 11, 2010.
Written Opinion—PCT/ US2010/036645, International Search Authority—European Patent Office Aug. 11, 2010.
International Search Report and Written Opinion—PCT/US2010/036645, International Search Authority—European Patent Office—Aug. 11, 2010.

* cited by examiner

*Primary Examiner* — Ly D Pham
(74) *Attorney, Agent, or Firm* — Semion Talpalatsky

(57) ABSTRACT

A method is disclosed that includes controlling current flow direction for current sent over a source line or a bit line of a magnetic memory device. A current generated magnetic field assists switching of a direction of a magnetic field of a free layer of a magnetic element within a spin transfer torque magnetic tunnel junction (STT-MTJ) device.

41 Claims, 13 Drawing Sheets

SPIN TRANSFER TORQUE—MAGNETIC TUNNEL JUNCTION DEVICE AND METHOD OF OPERATION

I. FIELD OF THE DISCLOSURE

The present disclosure relates generally to nonvolatile memory devices, and more particularly, to magnetic tunnel junction (MTJ) devices that use spin torque transfer.

II. BACKGROUND

Magnetic random access memory (MRAM) is a nonvolatile memory technology that uses magnetization to represent stored data. An MRAM generally includes a plurality of magnetic cells in an array. Each cell represents one bit of data. A cell includes a magnetic element, such as an MTJ device.

Ferromagnetic plates of an MTJ device typically include a free layer and a pinned layer (fixed layer) separated by a thin tunneling barrier layer. The plates are associated with a magnetization direction (or orientation of magnetic moments). In the free layer, the magnetization direction is free to rotate. An anti-ferromagnetic layer may be used to fix the magnetization of the pinned layer in a particular direction. A bit is written to the MTJ device by changing the magnetization direction of a free layer of the ferromagnetic plates of the magnetic element. Depending upon the orientations of the magnetic moments of the free layer and the pinned layer, the resistance of the MTJ device is changed.

Spin torque transfer (STT) is one technique used for writing to MTJ devices. Where a spin-polarized current is applied to the free layer, electrons are repolarized. The repolarizing of the electrons leads to the free layer experiencing a torque associated with the change in the angular momentum of the repolarized electrons. As a result, if the current density, or switching current, is high enough, this torque can switch the direction of the magnetization of the free layer.

The advantages of using STT for writing to magnetic elements include smaller bit cell size and nonvolatile storage. Such advances have led to more demand to improve performance and promote scalability for broader application. For example, there is a need to design MRAMs that reduce magnetic field interference between neighboring MTJ devices. In addition, there is a need to reduce switching currents.

III. SUMMARY

A particular embodiment controls current through a bit line or a source line of an STT-MTJ device to offset a magnetic field applied to a free layer. The magnetic field that is offset may be generated by electrodes proximate the bit and source lines where a switching current is applied. Offsetting the magnetic field on an MTJ easy axis may reduce the switching current during a write operation. The current-induced magnetic field may facilitate an MTJ stray field offset at the free layer of the MTJ device. One or both of the bit line and the source line may be orthogonally positioned relative to a long, or easy, axis of the STT-MTJ device. The resultant current generated magnetic field may be parallel to the easy axis and may be used to modulate the net magnetic moment of the STT-MTJ device.

In another particular embodiment, a constant current may be applied at the bit line or the source line during switching to generate a constant magnetic field at the free layer. A magnetic field generated by the bit line or source line current may be oriented in a reverse direction to the free layer magnetic moment. Current may flow in opposite directions over the bit line and the source line to generate a desired magnetic field offset. The direction of current in the bit line, the source line, or both, may further be set to reduce potential electromagnetic interference in neighboring STT-MTJ devices.

In another particular embodiment, a method is disclosed that includes controlling current flow direction for current over a source line or a bit line to generate a current generated magnetic field. The current generated magnetic field assists with switching a direction of a magnetic field of a free layer of a magnetic memory element within an STT-MTJ device.

In another particular embodiment, an apparatus includes an STT-MTJ device that has a free layer associated with a magnetic field. The apparatus further includes a bit line, a source line, and a control logic circuit. Both the bit line and the source line are in electrical communication with the STT-MTJ device. The control logic circuit is configured to control a current flow direction for current sent over the source line or the bit line to generate a current generated magnetic field that assists switching of a direction of the magnetic field associated with the free layer of the STT-MTJ device.

In another particular embodiment, a computer readable tangible medium stores computer executable code that includes code executable by a computer to automatically control current flow direction for current over a source line or a bit line to generate a current generated magnetic field. The current generated magnetic field is applied to assist switching of a direction of a magnetic field of a free layer of a magnetic memory element within an STT-MTJ device.

In another particular embodiment, an apparatus includes a current path supporting current flows through a plurality of STT-MTJ devices in a fixed direction. Another current path supports current flow through the plurality of STT-MTJ devices in an opposite direction to the fixed direction.

In another particular embodiment, an apparatus includes an STT-MTJ device and means for controlling current flow direction for current sent over a source line or a bit line to generate a current generated magnetic field to assist switching of a direction of a magnetic field of a free layer of a magnetic element within the STT-MTJ device.

In another particular embodiment, a method includes receiving design information that includes physical positioning information of a packaged semiconductor device on a circuit board. The packaged semiconductor device includes a structure comprising an STT-MTJ device that includes a free layer associated with a magnetic field. The packaged semiconductor device also includes a bit line in electronic communication with the STT-MTJ device, a source line in electronic communication with the STT-MTJ device, and a control logic circuit. The control logic circuit is configured to control a current flow direction for current sent over the source line or the bit line to generate a current generated magnetic field to assist switching of a direction of the magnetic field associated with the free layer of the STT-MTJ device.

Particular advantages provided by disclosed embodiments may include reduced switching current. Embodiments may additionally reduce magnetic interference between neighboring STT-MTJ cells of an MRAM. Aspects of the embodiments may thus improve performance and scalability for STT-MRAM memory devices.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
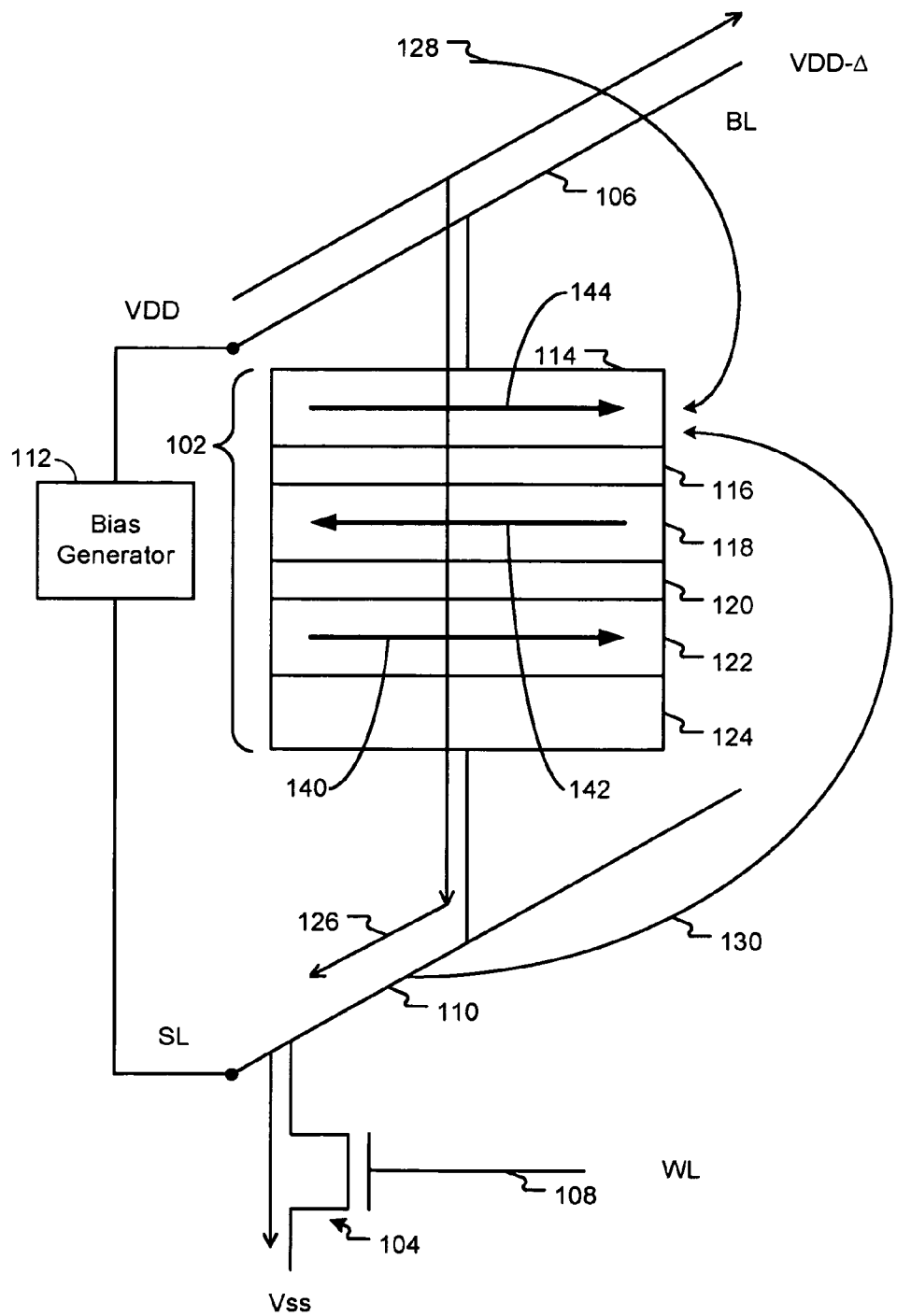
FIG. 1 is a diagram of a memory cell of an STT-MTJ device configured to execute a write operation involving switching from an anti-parallel configuration to a parallel configuration.

FIG. 1 is a diagram of a memory cell 100 of a spin torque transfer magnetic random access memory (STT-MRAM) configured to execute a write operation. The memory cell 100 is configured to execute a switching operation from an anti-parallel configuration to a parallel configuration. The memory cell 100 includes a magnetic tunnel junction (MTJ) device 102, a transistor 104, a bit line 106, and a word line 108. The memory cell 100 also includes a source line 110 and a bias generator 112.

The MTJ device 102 may include a free layer 114, a barrier layer 116, a pin layer 118, a spacer layer 120, and a pinned layer 122. The exemplary MTJ device 102 further includes an anti-ferromagnetic layer 124.

The bias generator 112 may generate a write voltage between the bit line 106 and the source line 110. The bias generator 112 may add an offset voltage in one side of the bitline 106 compared to another side of the bit line 106. Depending on a polarity of the voltage between the bit line 106 and the source line 110, a polarity of the free layer 114 of the MTJ device 102 may be changed. The corresponding logic state may be written to the memory cell 100.

Figure 2:
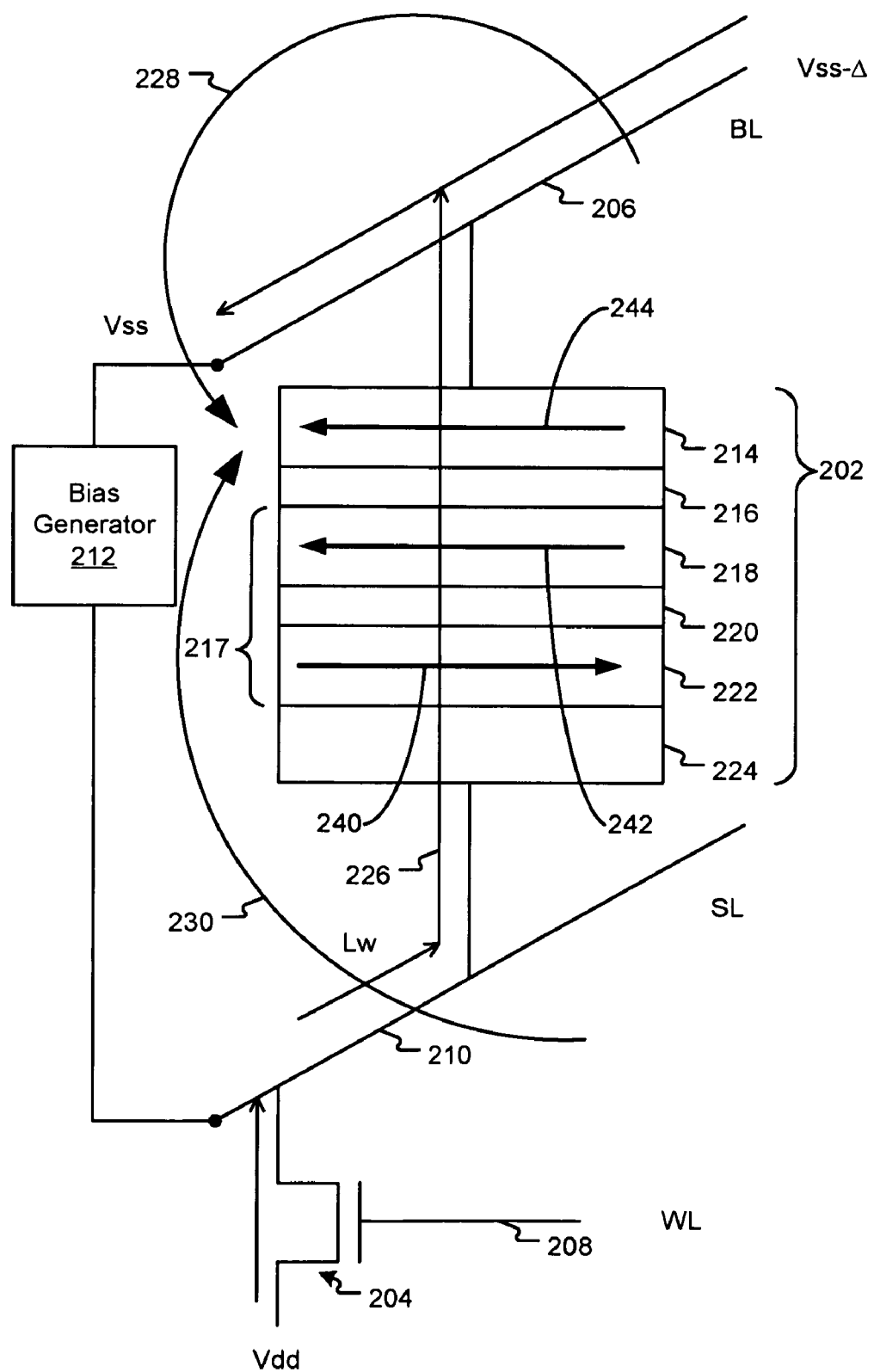
FIG. 2 is a diagram of a memory cell of an STT-MTJ device similar to that shown in FIG. 1 and that is configured to execute a write operation involving a switching operation from a parallel to an anti-parallel configuration.

An electrical resistance of the MTJ device 102 changes based on the polarity of the free layer 114. This change is attributable to the STT tunnel magnetoresistance effect. Where the pin layer 118 and the free layer 114 have the same polarity (post write), the resistance is low. In this case, a logic "0" is written to the memory cell 100. An MTJ device in such a state is in a parallel configuration. If the pin layer 118 and the free layer 114 have opposite polarities, the resistance is higher, and a logic "1" is written to the memory cell 100 (as shown in FIG. 2). Such a configuration is referred to as an anti-parallel configuration.

As shown in FIG. 1, a magnetic moment of the pinned layer 122 is denoted by an arrow 140. The magnetic moment of the pin layer 118 is denoted by an arrow 142. The magnetic moment of the free layer 114 is denoted by an arrow 144, which is oriented in an anti-parallel direction to the arrow 142. The orientation of the MTJ device 102 is consequently anti-parallel (prior write operation).

Current may be propagated along a path 126 through the bit line 106 and the source line 110 to establish magnetic fields 128 and 130. One or both of the magnetic fields 128, 130 may oppose or otherwise offset a magnetic moment of the free layer 114. One such undesirable magnetic field that is offset by the magnetic fields 128, 130 may originate from electrodes proximate to the bit line 106 or to the source line 110 when a switching current is applied. The resultant offset magnetic field may enable reduced the switching current from an anti-parallel to a parallel state of the free layer 114 of the STT-MRAM of the memory cell 100. Accordingly, the switching current for writing and storing data in the MTJ device 102 may be reduced.

One or both of the magnetic fields 128, 130 may be directed towards the easy axis of the memory cell 100. The easy axis may align with the longest dimension of the memory cell 100. For example, the longest dimension may be parallel to the source line 110, the bit line 106, or both. Alternatively, the shortest dimension, or hard axis, of an MTJ device may be parallel to the source line 110, the bit line 106, or both. In one embodiment, the current used to create the magnetic fields 128, 130 may range from about 50 µA to about 150 µA. In another embodiment, the current may range from about 150 µA to about 400 µA.

FIG. 1 thus shows a memory cell 100 configured to accomplish a switching operation with reduced current demands. Current is sent through the bit line 106 or the source line 110 to generate at least one offsetting magnetic field 128, 130. The memory cell 100 of FIG. 1 may use one or more of the current-generated magnetic fields 128, 130 to offset the magnetic field during a transition between a parallel and an anti-parallel state. Offsetting the magnetic field may reduce the switching current needed during the write operation. The current-generated magnetic field may facilitate spin torque transfer at the free layer 114 of an MTJ easy axis. An MTJ easy axis may include a long axis of MTJ for example, the MTJ may be designed to have long and short axes. The resultant current-generated magnetic field may be substantially parallel to the easy axis of the MTJ device 102 and may be used to modulate a net magnetic moment of the MTJ device 102.

FIG. 2 is a diagram that illustrates a particular embodiment of a memory cell 200 of an STT-MRAM similar to that shown in FIG. 1 that is executing a switching operation from a parallel to an anti-parallel state. Current flows over a path 226 in an opposite direction than the path 126 of FIG. 1. The memory cell 200 includes an MTJ device 202, a transistor 204, a bit line 206, a word line 208, a source line 210, and a bias generator 212.

The MTJ device 202 may include a free layer 214, a barrier layer 216, and a synthetic pinned layer 217. The synthetic pinned layer 217 may include a pin layer 218, a spacer layer 220, and a pinned layer 222. The exemplary MTJ device 202 further includes an anti-ferromagnetic (AFM) layer 224.

As shown in FIG. 2, a magnetic moment of the pinned layer 222 is denoted by an arrow 240. The magnetic moment of the pin layer 218 is denoted by an arrow 242. The magnetic moment of the free layer 214 is denoted by an arrow 244, which is oriented in a parallel direction to the arrow 242. The orientation of the MTJ device 202 is consequently in a parallel state and is ready to be switched to anti-parallel state.

Current may be propagated along the path 226 through one or both of the bit line 206 and the source line 210 to establish at least one magnetic field 228, 330. The magnetic fields 228, 230 may offset the magnetic moment of the free layer 214. The field that is offset may help to reduce switching current. The resultant offset magnetic field allows a reduction in the switching current from a parallel to an anti-parallel state of the free layer 214 of the STT-MRAM of the memory cell 200. Current is sent through one or both of the bit line 206 and the source line 210 to generate an offset magnetic field. The memory cell 200 uses current-induced magnetic fields to generate the offset magnetic field during a transition from a parallel to an anti-parallel state. Thus, the memory cell 200 is configured to accomplish a switching operation with reduced switching current demands.

Figure 3:
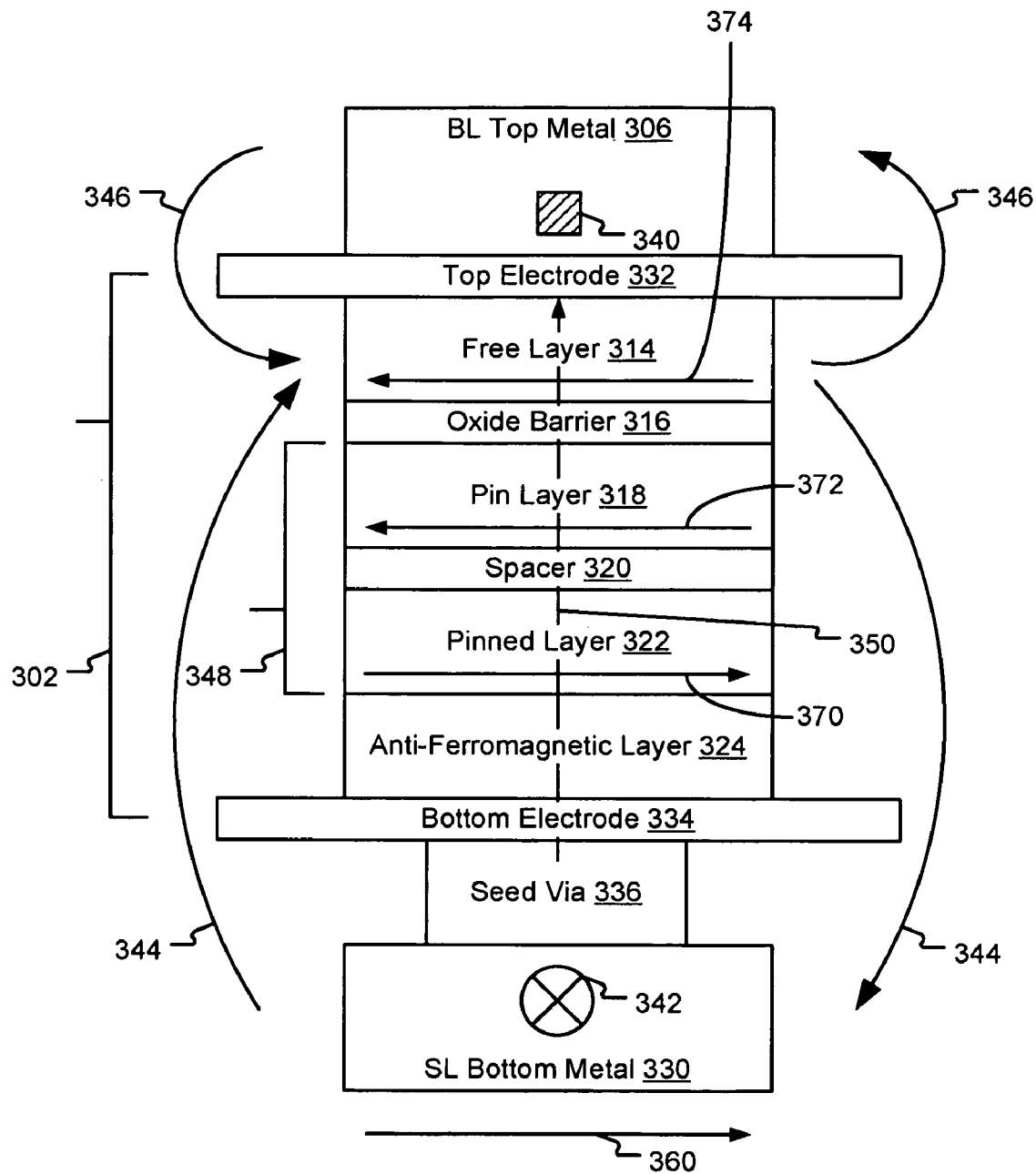
FIG. 3 shows a cross-section of a memory cell of an STT-MTJ device similar to that shown in FIG. 2.

FIG. 3 shows a cross-section of a memory cell 300 of an STT-MRAM similar to the memory cell 200 of FIG. 2 and configured to execute a write operation. FIG. 3 further illustrates an STT-MRAM configured to execute a switching operation from a parallel to an anti-parallel state. The memory cell 300 may be formed on a substrate such as a semiconductor substrate including, for example, silicon, germanium, and/or a compound semiconductor material. The memory cell 300 includes a bit line 306 and a source line 330. The bit line 306 and the source line 330 may be formed of material suitable to conduct electricity, such as Al, Cu, Au, Ag, and Ta. At least one of the bit line 306 and the source line 330 may supply current to an MTJ device 302. In FIG. 3, current flows in a direction as denoted by 340 as traveling along an axis of the bit line 306 and out of the page. As denoted by 342, current also flows into the page and along an axis of the source line 330.

The bit line 306 may be coupled to a top electrode 332. The source line 330 may be coupled to a bottom electrode 334. In the embodiment of FIG. 3, a seed via 336 is coupled to both the source line 330 and the bottom electrode 334. The seed via 336 may facilitate electrical connectivity between the source line 330 and the bottom electrode 334 where other structures (not shown) are present between portions of the source line 330 and the bottom electrode 334.

The MTJ device 302 may include a free layer 314, a barrier layer (e.g., an oxide barrier) 316, and a synthetic pinned layer 348. The synthetic pinned layer 348 may include a pin layer 318, a spacer layer 320, and a pinned layer 322. The illustrative MTJ device 302 further includes an anti-ferromagnetic layer 324. The anti-ferromagnetic layer 324 may include one or more anti-ferromagnetic layers. In the embodiment illustrated in FIG. 3, the free layer 314 is coupled to the top electrode 332, and the anti-ferromagnetic layer 324 is coupled to the bottom electrode 334. Line 360 shows a direction of a magnetic anneal associated with the MTJ device 302.

In FIG. 3, current flows along an axis of the bit line 306 and out of the page, as denoted by 340. As denoted by 342, current also flows into the page and along an axis of the source line 330. Current flows along a path 350 through the MTJ device 302. The current flow 342 through the source line 330 may generate a first magnetic field 344 that affects and may offset a magnetic moment of the free layer 314. The current flow 340 through the bit line 306 may generate a magnetic field 346 that may alternatively or additionally offset the magnetic moment of the free layer 314.

As shown in FIG. 3, a magnetic moment of the pinned layer 322 is denoted by an arrow 370. The magnetic moment of the pin layer 318 is denoted by an arrow 372. The magnetic moment of the free layer 314 is denoted by an arrow 374, which is oriented in a parallel direction to the arrow 372. The orientation of the MTJ device 302 is consequently parallel.

In this manner, the memory cell 300 with the seed via 336 shown in FIG. 3 may provide current-generated, offsetting magnetic fields that facilitate a switch from a parallel to an anti-parallel state. Offsetting the magnetic field may reduce the switching current during the write operation. The current-generated magnetic field may facilitate spin torque transfer at the free layer 314. The resultant current-generated magnetic field may be used to modulate a net magnetic moment of the MTJ device 302.

Figure 4:
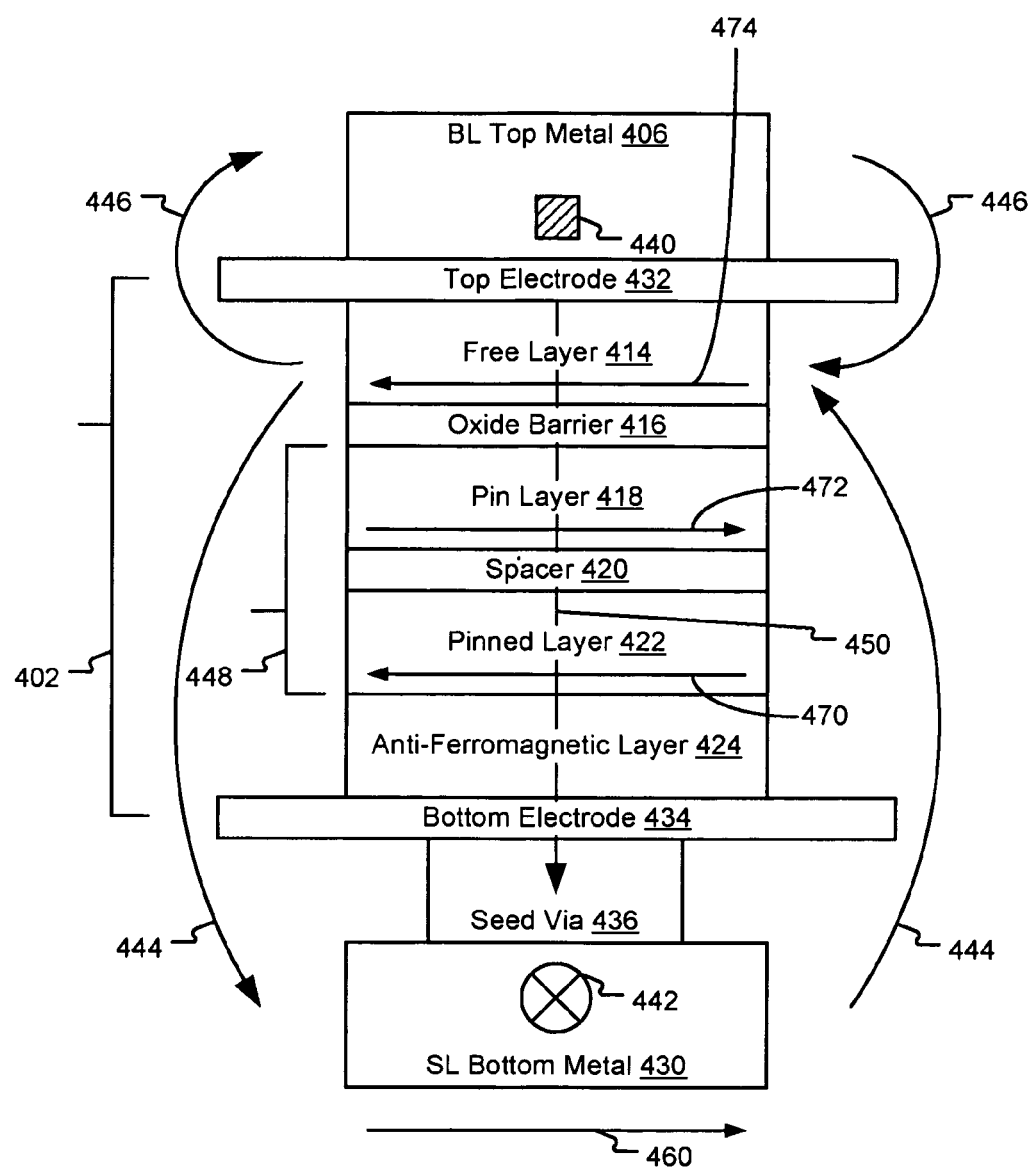
FIG. 4 shows a cross-section of a memory cell of an STT-MTJ device similar to that shown in FIG. 3 and that is configured to execute a switching operation from an anti-parallel to a parallel state.

FIG. 4 shows a cross-section of a memory cell 400 of an STT-MRAM similar to that shown in FIG. 1 that is executing a switching operation from an anti-parallel state to a parallel state. The memory cell 400 includes a bit line 406 and a source line 430. At least one of the bit line 406 and the source line 430 may supply current to an MTJ device 402. In FIG. 4, current flows in a direction as denoted by 440 along an axis of the bit line 406 and into the page. As denoted by 442, current also flows out of the page and along an axis of the source line 430.

As shown in FIG. 4, a magnetic moment of the pinned layer 422 is denoted by an arrow 470. The magnetic moment of the pin layer 418 is denoted by an arrow 472. The magnetic moment of the free layer 414 is denoted by an arrow 474, which is oriented in an opposite direction to the arrow 472. The orientation of the MTJ device 402 is consequently anti-parallel.

The bit line 406 may be coupled to a top electrode 432. The source line 430 may be coupled to a bottom electrode 434. In the embodiment of FIG. 4, a seed via 436 is coupled to both the source line 430 and the bottom electrode 434. The seed via 436 may facilitate electrical connectivity between the source line 430 and the bottom electrode 434 where other structures (not shown) are present between portions of the source line 430 and the bottom electrode 434.

The MTJ device 402 may be coupled to the electrodes 432, 434. The MTJ device 402 may include the free layer 414, a barrier layer (e.g., an oxide barrier) 416, and a synthetic pinned layer 448. The synthetic pinned layer 448 may include a pin layer 418, a spacer layer 420, and a pinned layer 422. The exemplary MTJ device 402 further includes an anti-ferromagnetic layer 424. The anti-ferromagnetic layer 424 may include one or more anti-ferromagnetic layers. In the embodiment illustrated in FIG. 4, the free layer 414 is coupled to the top electrode 432, and the anti-ferromagnetic layer 424 is coupled to the bottom electrode 434. The line 460 shows a direction of a magnetic anneal associated with the MTJ device 402.

In FIG. 4, current flows along an axis of the bit line 406 and into the page, as denoted by 440. As denoted by 442, current also flows out of the page and along an axis of the source line 430. Current flows along a path 450 through the MTJ device 402. The current flow 442 through the source line 430 may generate a first magnetic field 444 that affects the free layer 414. The current flow 440 through the bit line 406 may generate another magnetic field 446 that also affects the free layer 414.

In this manner, the memory cell 400 with the seed via 436 shown in FIG. 4 may provide current-generated, offsetting magnetic fields that facilitate a switch between an anti-parallel state to a parallel state. Offsetting the magnetic fields may allow a reduction in the switching current during the write operation. The current-generated magnetic fields may facilitate spin torque transfer at the free layer 414. The resultant current-generated magnetic fields may be used to modulate a net magnetic moment of the MTJ device 402.

Figure 5:
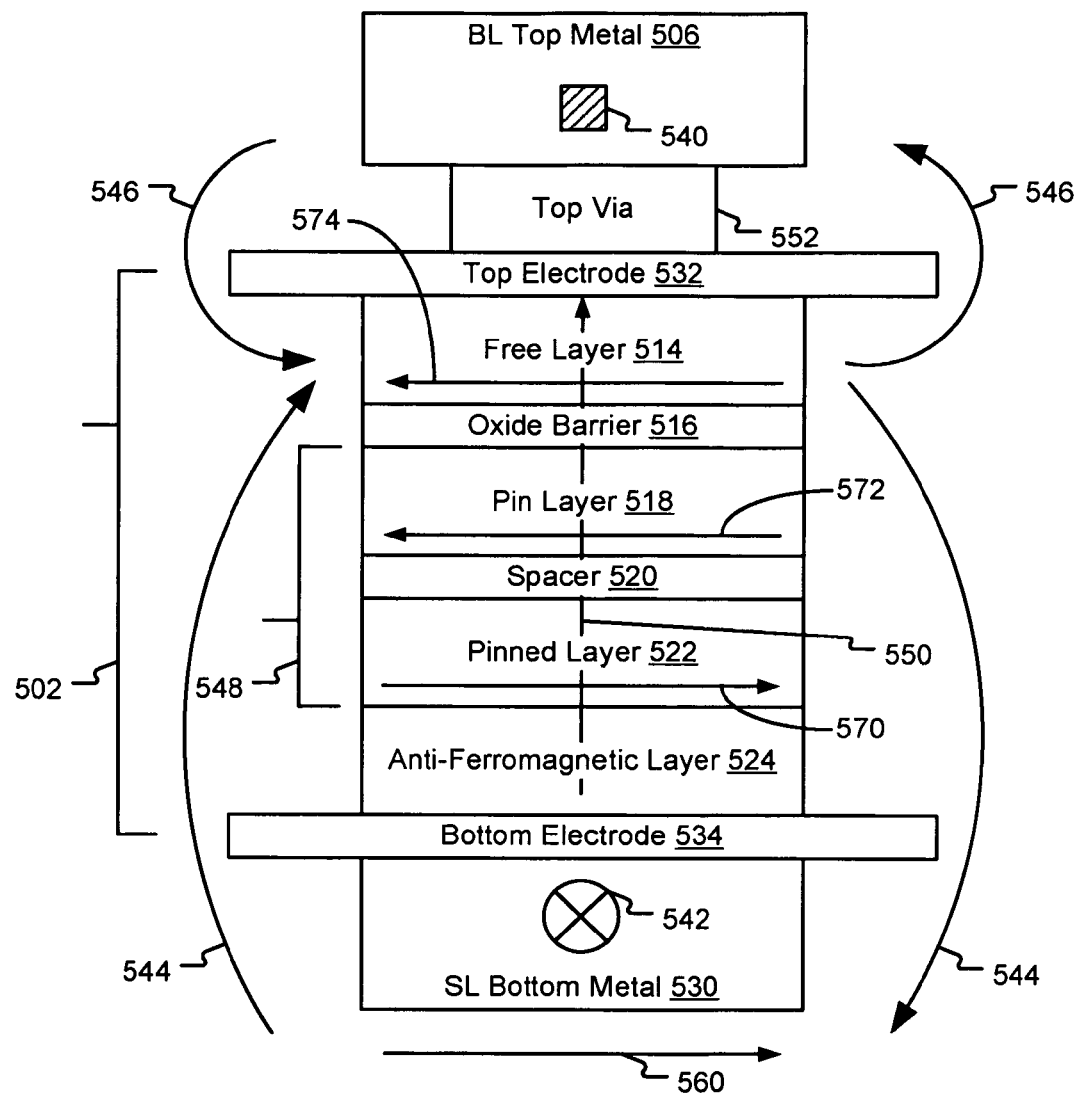
FIG. 5 shows a cross-section of a memory cell of an STT-MTJ device similar to that shown in FIG. 3 and that includes a top via, but without a bottom via.

FIG. 5 shows a cross-section of a memory cell 500 of an STT-MRAM similar to that shown in FIG. 3, but with no seed via and including a top via 552. The exemplary memory cell 500 may execute a switching operation from a parallel to an anti-parallel state. The memory cell 500 includes a bit line 506 and a source line 530. At least one of the bit line 506 and the source line 530 may supply current to an MTJ device 502. In FIG. 5, current flows in a direction as denoted by 540 as traveling along an axis of the bit line 506 and out of the page. As denoted by 542, current also flows into the page and along an axis of the source line 530.

The bit line 506 may be coupled to a top electrode 532. The source line 530 may be coupled to a bottom electrode 534. In the embodiment of FIG. 5, the top via 552 is coupled to both the bit line 506 and the top electrode 532. The top via 552 may facilitate electrical connectivity between the bit line 506 and the top electrode 532 where other structures (not shown) are present between portions of the bit line 506 and the top electrode 532.

The MTJ device 502 may be coupled to the electrodes 532, 534. The MTJ device 502 may include a free layer 514, a barrier layer (e.g., an oxide barrier) 516, and a synthetic pinned layer 548. The synthetic pinned layer 548 may include a pin layer 518, a spacer layer 520, and a pinned layer 522. The exemplary MTJ device 502 further includes an anti-ferromagnetic layer 524. In the embodiment illustrated in FIG. 5, the free layer 514 is coupled to the top electrode 532, and the anti-ferromagnetic layer 524 is coupled to the bottom electrode 534. A line 560 shows a direction of a magnetic anneal associated with the MTJ device 502.

As shown in FIG. 5, a magnetic moment of the pinned layer 522 is denoted by an arrow 570. The magnetic moment of the pin layer 518 is denoted by an arrow 572. The magnetic moment of the free layer 514 is denoted by an arrow 574, which is oriented in a parallel direction to the arrow 572. The orientation of the MTJ device 502 is consequently parallel.

In FIG. 5, current flows along an axis of the bit line 506 and out of the page, as denoted by 540. As denoted by 542, current also flows into the page and along an axis of the source line 530. Current flows along a path 550 through the MTJ device 502. The current flow 542 through the source line 530 may generate a first magnetic field 544 that affects the free layer 514.

The current flow 540 through the bit line 506 may generate another magnetic field 546 that alternatively or additionally offsets a magnetic moment of the free layer 514. In this manner, the memory cell 500 with the top via 552 shown in FIG. 5 may provide current-generated offsetting magnetic fields that facilitate a switch between a parallel and an anti-parallel state with a reduced switching current.

The directions of the respective current paths 540, 542, 550 may be reversed in an embodiment where the memory cell 500 conducts a current switch between an anti-parallel state and a parallel state. Offsetting the magnetic fields may reduce the switching current during the write operation. The current-generated magnetic fields may facilitate spin torque transfer at the free layer 514. The resultant current-generated magnetic fields may be used to modulate a net magnetic moment of the MTJ device 502.

Figure 6:
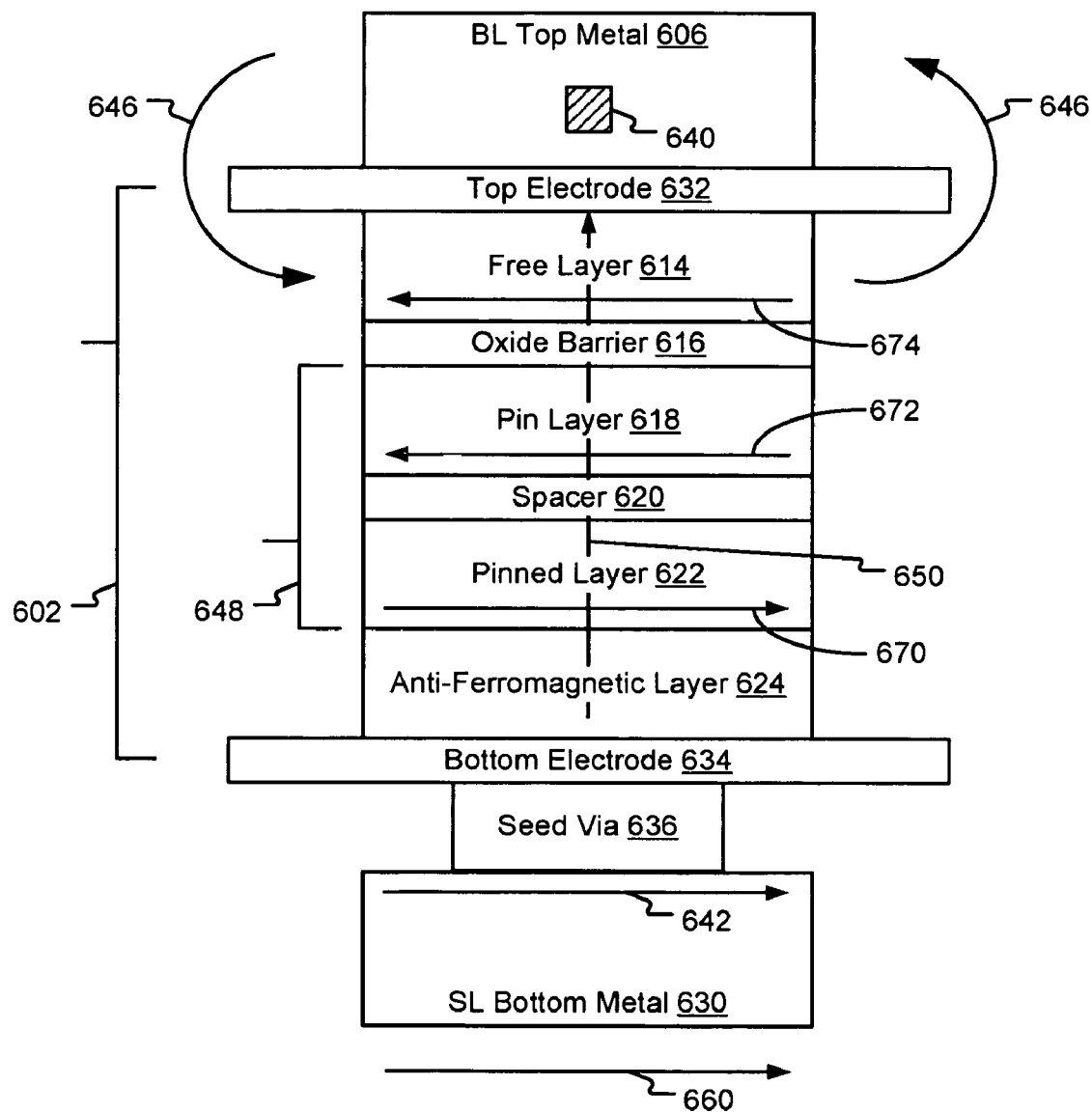
FIG. 6 shows a cross-section of a memory cell of an STT-MTJ device similar to that shown in FIG. 3 and that includes a source line having an axis that is perpendicular to an axis of a bit line.

FIG. 6 shows a cross-section of a memory cell 600 of an STT-MRAM similar to that shown in FIG. 3, but including a source line 630 having an axis that is perpendicular to an axis of a bit line 606. The exemplary memory cell 600 may execute a switching operation from a parallel state to an anti-parallel state. At least one of the bit line 606 and the source line 630 may supply current to an MTJ device 602. In FIG. 6, current flows in a direction as denoted by 640 as traveling along an axis of the bit line 606 and out of the page. As denoted by 642, current also flows along an axis of the source line 630. Thus, in FIG. 6, the direction of the current flow 640 in the bit line 606 is perpendicular to the direction of the current flow 642 of the source line 630.

The bit line 606 may be coupled to a top electrode 632. The source line 630 may be coupled to a bottom electrode 634. In the embodiment of FIG. 6, a seed via 636 couples the source line 630 to the bottom electrode 634. The seed via 636 may facilitate electrical connectivity between the source line 630 and the bottom electrode 634 where other structures (not shown) are present between portions of the source line 630 and the bottom electrode 634. A line 660 shows a direction of a magnetic anneal associated with the MTJ device 602.

The MTJ device 602 may be coupled to the electrodes 632, 634. The MTJ device 602 may include a free layer 614, a barrier layer 616, and a synthetic pinned layer 648. The synthetic pinned layer 648 may include a pin layer 618, a spacer layer 620, and a pinned layer 622. The exemplary MTJ device 602 further includes an anti-ferromagnetic layer 624.

As shown in FIG. 6, a magnetic moment of the pinned layer 622 is denoted by an arrow 670. The magnetic moment of the pin layer 618 is denoted by an arrow 672. The magnetic moment of the free layer 614 is denoted by an arrow 674, which is oriented in a parallel direction to the arrow 672. The orientation of the MTJ device 602 is consequently parallel.

In FIG. 6, current flows along an axis of the bit line 606 and out of the page, as denoted by 640. As denoted by 642, current also flows along an axis of the source line 630. Current flows along a path 650 through the MTJ device 602. The current flow 640 through the bit line 606 may generate a magnetic field 646 that affects the free layer 614. Current flow 642 through the source line 630 may additionally generate a magnetic field (not shown). In this manner, the memory cell 600 with the seed via 636 and the source line 630 that is orthogonally arranged relative to the bit line 606 may facilitate a current switch between a parallel state to an anti-parallel state with a reduced switching current. The directions of the respective current paths 640, 642, 650 may be reversed in an embodiment where the memory cell 600 conducts a current switch between an anti-parallel state and a parallel state.

Offsetting the magnetic fields in the free layer 614 may reduce the switching current by facilitating spin torque transfer. The resultant current-generated magnetic field at the free layer 614 may be used to modulate a net magnetic moment of the MTJ device 602.

Figure 7:
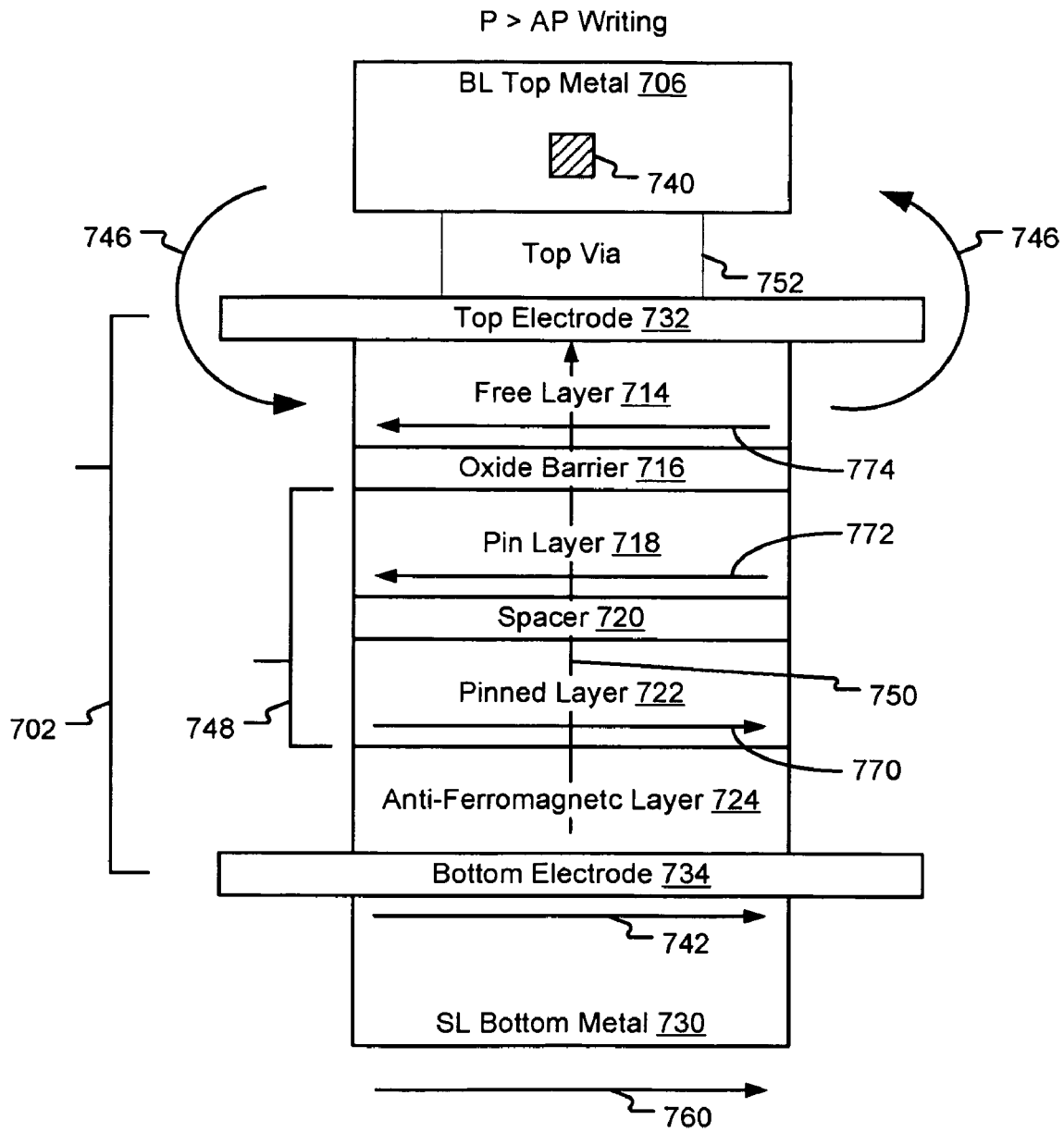
FIG. 7 shows a cross-section of a memory cell of an STT-MTJ device similar to that shown in FIG. 5 and that includes a source line having an axis that is perpendicular to an axis of a bit line.

FIG. 7 shows a cross-section of a memory cell 700 of an STT-MRAM similar to that shown in FIG. 6, but including a top via 752 instead of a seed via (e.g., the seed via 636 of FIG. 6). The exemplary memory cell 700 may execute a switching operation from a parallel state to an anti-parallel state. At least one of the bit line 706 and the source line 730 may supply current to an MTJ device 702. In FIG. 7, current flows in a direction as denoted by 740 along an axis of the bit line 706 and out of the page. As denoted by 742, current also flows along an axis of the source line 730.

The bit line 706 may be coupled to a top electrode 732. The source line 730 may be coupled to a bottom electrode 734. In the embodiment of FIG. 7, the top via 752 is coupled to the bit line 706 and the top electrode 732. The top via 752 may facilitate electrical connectivity between the bit line 706 and the top electrode 732 where other structures (not shown) are present between portions of the bit line 706 and the top electrode 732. A line 760 shows a direction of a magnetic anneal associated with the MTJ device 702.

The MTJ device 702 may be coupled to the electrodes 732, 734. The MTJ device 702 may include a free layer 714, a barrier layer 716, and a synthetic pinned layer 748. The synthetic pinned layer may include a pin layer 718, a spacer layer 720, and a pinned layer 722. The exemplary MTJ device 702 further includes an anti-ferromagnetic layer 724.

As shown in FIG. 7, a magnetic moment of the pinned layer 722 is denoted by an arrow 770. The magnetic moment of the pin layer 718 is denoted by an arrow 772. The magnetic moment of the free layer 714 is denoted by an arrow 774, which is oriented in a parallel direction to the arrow 772. The orientation of the MTJ device 702 is consequently parallel.

Current flows in FIG. 7 along an axis of the bit line 706 and out of the page, as denoted by 740. As denoted by 742, current also flows along an axis of the source line 730. Current flows along a path 750 through the MTJ device 702. The current flow 740 through the bit line 706 may generate a magnetic field 746 that affects the free layer 714. Current flow 742 through the source line 730 may additionally generate a magnetic field (not shown). By offsetting the magnetic field in the free layer 714, spin torque transfer may be facilitated and the switching current may be reduced. The resultant current generated magnetic field at the free layer 714 may be used to modulate the net magnetic moment of the MTJ device 702.

In this manner, the memory cell 700 with the top via 752 and the source line 730 that is orthogonally arranged relative to the bit line 706 may facilitate a current switch from a parallel to an anti-parallel state with a reduced switching current. Directions of the respective current paths 740, 742, 750 may be reversed in an embodiment where the memory cell 700 conducts a current switch from an anti-parallel state to a parallel state.

Figure 8:
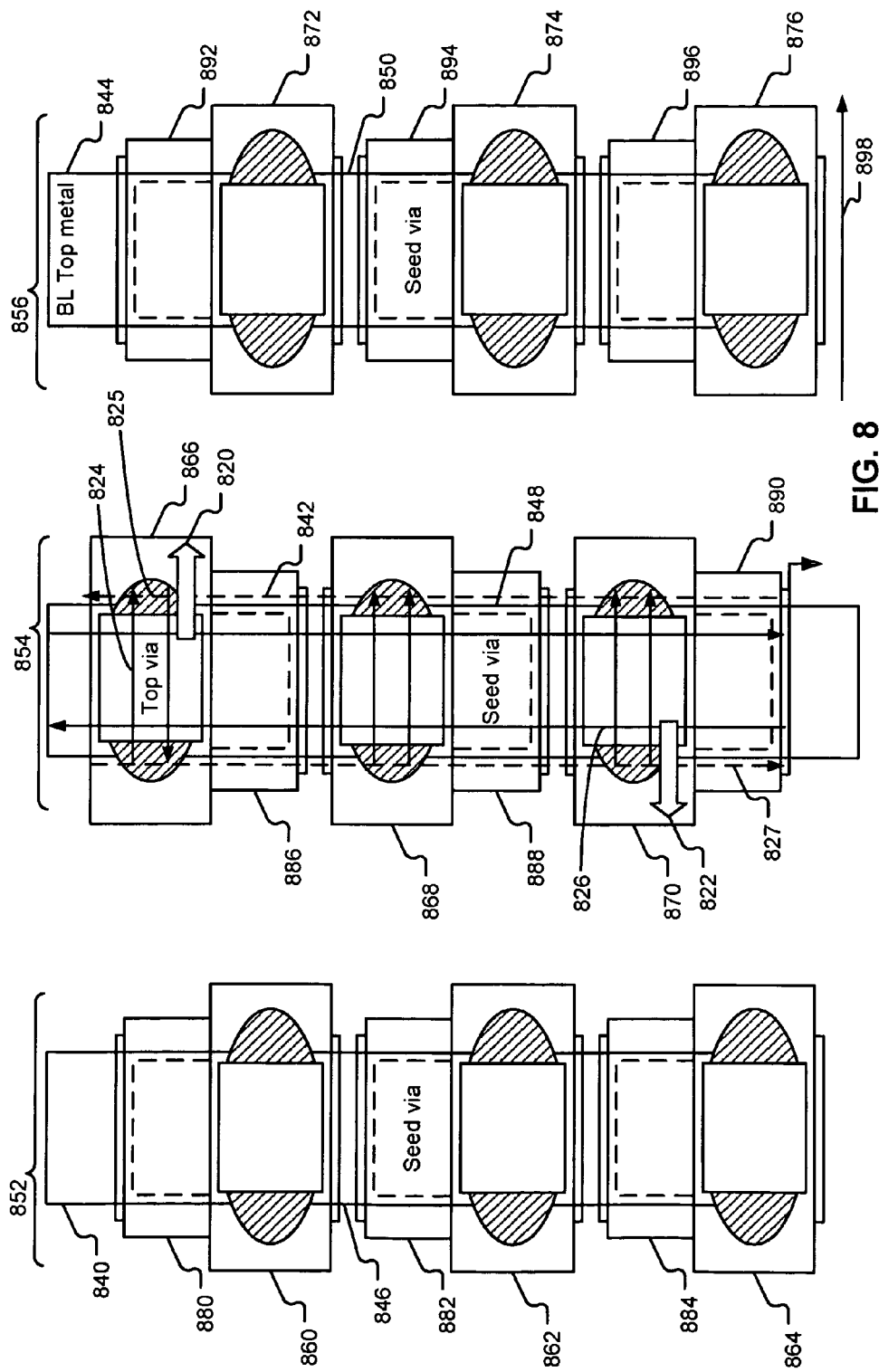
FIG. 8 shows an MRAM layout that includes an arrangement of MTJ devices generally of the type illustrated in FIGS. 2-5.

FIG. 8 shows an MTJ layout 800 that includes an arrangement of MTJ devices generally of the type described in FIGS. 3-5. The exemplary layout 800 may comprise a portion of an MRAM. A column 852 may include a bit line 840 and a source line 846 arranged along a common axis. A column 854 may include a bit line 842 and a source line 848 arranged along a common axis, and column 856 may include a bit line 844 and a source line 850 arranged along a common axis. Columns 852, 854, and 856 may be parallel to each other.

The layout 800 may include multiple MTJ devices 860, 862, 864, 866, 868, 870, 872, 874, 876. MTJ device 860 may be coupled to electrode 880. MTJ device 862 may be coupled to electrode 882. MTJ device 864 may be coupled to electrode 884. MTJ device 866 may be coupled to electrode 886. MTJ device 868 may be coupled to electrode 888. MTJ device 870 may be coupled to electrode 890. MTJ device 872 may be coupled to electrode 892. MTJ device 874 may be coupled to electrode 894. MTJ device 876 may be coupled to electrode 896. A line 898 shows a direction of a magnetic anneal associated with the MTJ devices 860, 862, 864, 866, 868, 870, 872, 874, 876.

An exemplary column 854 shows generated magnetic fields 820, 822. The column 854 illustrates a first current path 824 in a bit line and a third current path 825 associated with a write operation from an anti-parallel state to a parallel state. The first current path 824 in a bit line may support current flow in a fixed direction. The third current path 825 in the column 854 may flow in an opposite direction relative to the first current path 824 and may correspond to a write operation from an anti-parallel state to a parallel state. The column 854 also includes a second current path 826 in a bit line and a fourth current path 827 associated with a write operation from a parallel state to an anti-parallel state. The second current path 826 in the bit line may support current flow in a fixed direction. The fourth current path 827 in the column 854 may flow in an opposite direction relative to the second current path 826 and may correspond to a write operation from a parallel state to an anti-parallel state.

FIG. 8 shows current-generated magnetic fields of the parallel columns 852, 854, 856 configured to minimally affect the operation of neighboring columns. For example, the orientation of the magnetic fields of the parallel columns 852, 854, 856 are stage oriented to reduce magnetic field interference between neighboring MTJ devices. The MTJ layout 800 of FIG. 8 also shows MTJ devices 862, 864, 866, 868, 870, 872, 874, 876 configured to operate with reduced switching current. The offsetting magnetic fields may reduce the amount of current used to switch the direction of the magnetization of the respective free layers of the MTJ devices 860, 862, 864, 866, 868, 870, 872, 874, 876.

Figure 9:
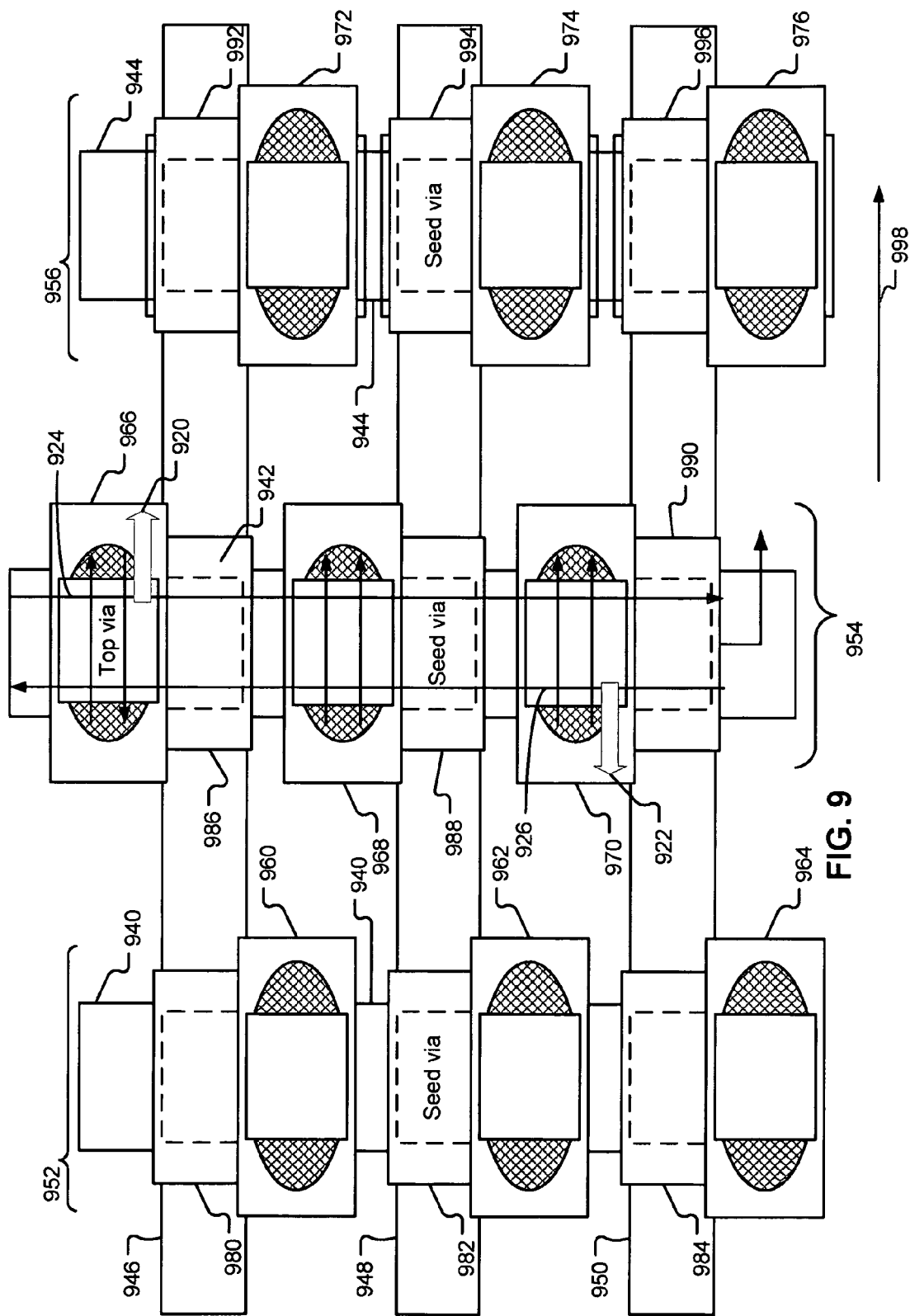
FIG. 9 shows an MRAM layout that includes an arrangement of MTJ devices generally of the type illustrated in FIGS. 6 and 7.

FIG. 9 shows an MTJ layout 900 that includes an arrangement of MTJ devices generally of the type described in FIGS. 6 and 7. A column 952 of memory cells includes a bit line 940. A column 954 is parallel to the column 952 and includes a bit line 942. A column 956 of memory cells is also parallel to column 952 and includes a bit line 944. The column 952 also includes a source line 946. The source line 946 is arranged along an axis that is orthogonal to that of the bit line 940. The column 954 includes a source line 948. The source line 948 is arranged along an axis that is orthogonal to that of the bit line 942. The column 956 includes a portion of a source line 950 that is orthogonal to the bit line 944. A line 998 shows a direction of a magnetic anneal associated with an MTJ device 960, 962, 964, 966, 968, 970, 972, 974, 976.

The layout 900 include multiple MTJ devices 960, 962, 964, 966, 968, 970, 972, 974, 976. MTJ device 960 may be coupled to electrode 980. MTJ device 962 may be coupled to electrode 982. MTJ device 964 may be coupled to electrode 984. MTJ device 966 may be coupled to electrode 986. MTJ device 968 may be coupled to electrode 988. MTJ device 970 may be coupled to electrode 990. MTJ device 972 may be coupled to electrode 992. MTJ device 974 may be coupled to electrode 994. MTJ device 976 may be coupled to electrode 996.

An exemplary column 954 of FIG. 9 includes offsetting magnetic fields 920, 922. The magnetic fields 920, 922 are aligned with the respective easy axis of each MTJ device 966, 970. The column 954 illustrates a first current path 924 associated with a write operation from an anti-parallel state to a parallel state. The direction of the first current path 924 may be fixed. A second current path 926 in the column 954 may travel in a perpendicular, or opposite, direction relative to the first current path 924 and may correspond to a write operation from a parallel state to an anti-parallel state.

FIG. 9 shows current-generated induced magnetic fields of columns 952, 954, 956 that may minimally affect the operation of neighboring columns. For example, the orientation of the magnetic fields of the columns 952, 954, 956 are stage oriented to reduce magnetic field interference between neighboring MTJ devices. The MTJ layout 900 of FIG. 9 also shows MTJ devices 962, 964, 966, 968, 970, 972, 974, 976 configured to operate with reduced switching current. The offsetting magnetic fields may reduce the amount of current used to switch the direction of the magnetization of the respective MTJ device free layers.

Figure 10:
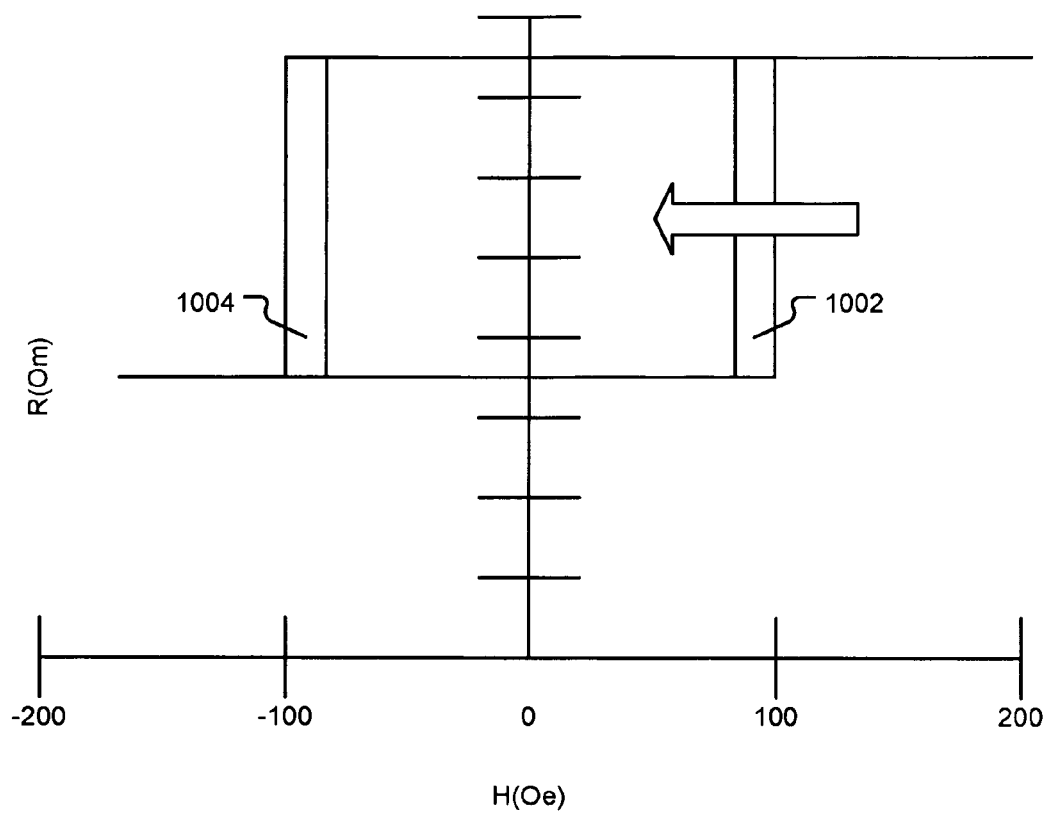
FIG. 10 is a RH loop graph that illustrates an offset magnetic field impacted on parallel to anti-parallel switching, such as may be generated by the current propagated through the bit line or the source line of FIG. 2.

FIG. 10 shows a graph 1000 that illustrates an offset magnetic field, such as a field that may be generated using current propagated through at least one of the bit line 206 and the source line 210 of FIG. 2. The R-H loop graph 1000 plots resistance R(Om) versus magnetic field H(Oe) to show a shift between two values 1002, 1004. The shift follows the arrow and represents a reduction in switching current used to switch states in an STT-MRAM device, such as is shown in FIG. 2. The offsetting magnetic field may reduce the switching current needed from a parallel state to an anti-parallel state of the STT-MRAM device. This reduced switching current may facilitate advances in reduced circuitry size and extended battery life, among other benefits.

Figure 11:
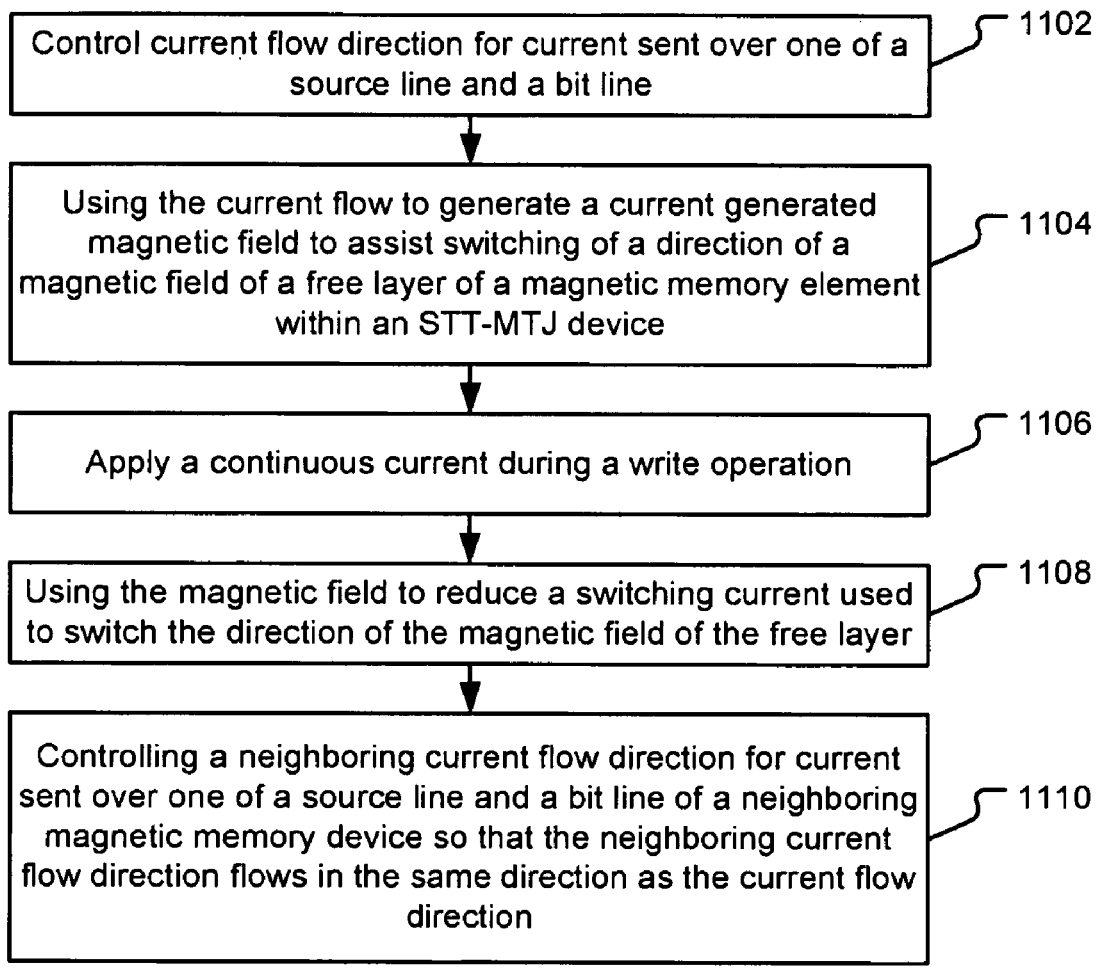
FIG. 11 is a flowchart showing a method of writing to magnetic memory that includes an STT-MTJ device of FIGS. 1-7.

FIG. 11 shows a method 1100 for writing to magnetic memory that includes an STT-MTJ device, e.g., the STT-MTJ device 102 of FIG. 1. At 1102, the method may control current flow direction for current sent over a source line or a bit line, such as one of the source line 110 and the bit line 106 of the STT-MTJ device 102. The current flow may be used to generate a current generated magnetic field, such as the current magnetic fields 128, 130 of FIG. 1, to assist switching of a direction of a magnetic field of a free layer, at 1104. For example, the direction of the magnetic field of the free layer 114 of a magnetic memory element within the STT-MTJ device 102 of FIG. 1 may be switched.

A continuous current may be applied during a write operation at the STT-MTJ device, at 1106. The method may use the current-generated magnetic field to reduce a switching current used to switch the direction of the magnetic field of the free layer, at 1108.

At 1110, the method may control a neighboring current flow direction for current sent over one of a source line and a bit line of a neighboring magnetic memory device, such as the source line 110 and a bit line 106 of FIG. 1. The neighboring current flow direction may be controlled such that the neighboring current flow direction flows in the same direction as the current flow direction. A neighboring MTJ cell may be staged in a different location as a target cell to minimize disturbance between each other.

FIG. 11 thus shows a method for writing magnetic memory in a manner that may reduce switching current of an STT-MTJ device. The method may further reduce magnetic interference between neighboring STT-MTJ devices. For example, the magnetic fields of the parallel columns 852, 854, 856 in FIG. 8 are stage oriented to reduce magnetic field interference between devices. The current-generated magnetic field may further reduce the switching current needed to affect the polarity of a free layer of an STT-MRAM, and consequently, the logic state of the memory cell. This reduced switching current may facilitate advances in further reduced circuit size and extended battery life, among other benefits.

Figure 12:
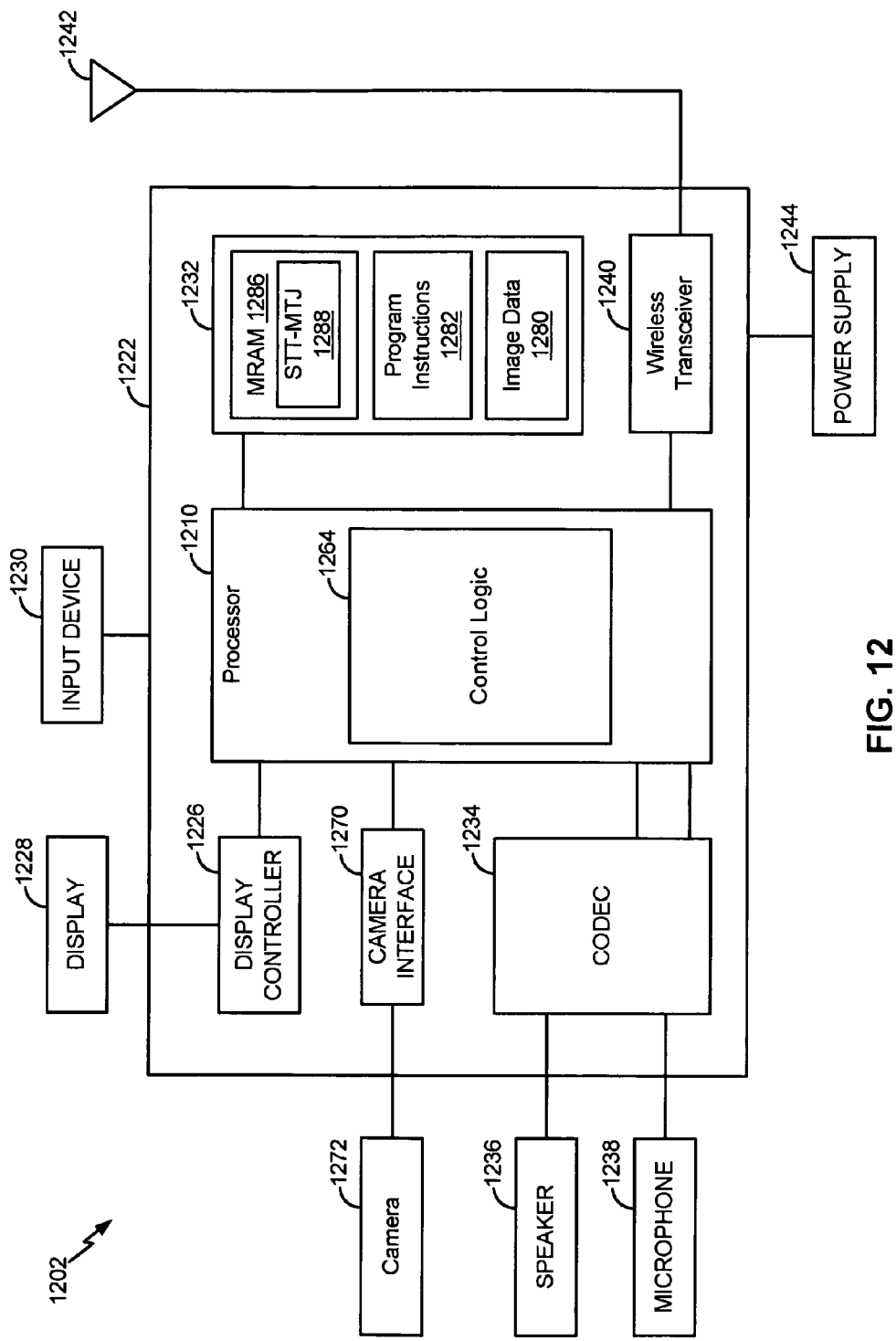
FIG. 12 is a block diagram of a particular embodiment of a system using the STT-MTJ device of the type illustrated in FIGS. 1-7.

FIG. 12 is a block diagram of particular embodiment of an apparatus 1200 including control logic circuit 1264 configured to control a current flow direction for current sent to one of a source and bit line of an MRAM 1286. For example, the control logic 1264 may adjust a voltage on the bit line or the source line to control the current flow direction. The current flow may be controlled in a manner that reduced the switching current needed to affect the polarity of the free layer of the MRAM 1286, and consequently, the logic state of the memory cell. Reduced switching current may facilitate advances in reduced circuit size and extended battery life, among other benefits.

The sent current generates a magnetic field to assist with switching of a direction of the magnetic field associated with a free layer of an STT-MTJ device 1288 associated with the MRAM 1286. The apparatus 1200 may be implemented in a portable electronic device and includes a processor 1210, such as a digital signal processor (DSP) coupled to a memory 1232.

A camera interface controller 1270 is coupled to the processor 1210 and is also coupled to a camera 1272, such as a video camera. The camera controller 1270 may be responsive to the processor 1210, such as for autofocusing and autoexposure control. A display controller 1226 is coupled to the processor 1210 and to a display device 1228. A coder/decoder (CODEC) 1234 can also be coupled to the processor 1210. A speaker 1236 and a microphone 1238 can be coupled to the CODEC 1234. A wireless interface 1240 can be coupled to the processor 1210 and to a wireless antenna 1242.

The processor 1210 may also be adapted to generate processed image data 1280. The display controller 1226 is configured to receive the processed image data 1280 and to provide the processed image data 1280 to the display device 1228. In addition, the memory 1232 may be configured to receive and to store the processed image data 1280, and the wireless interface 1240 may be configured to retrieve the processed image data 1280 for transmission via the antenna 1242.

In a particular embodiment, the processor 1210, the display controller 1226, the memory 1232, the CODEC 1234, the wireless interface 1240, and the camera controller 1270 are included in a system-in-package or system-on-chip device 1222. In a particular embodiment, an input device 1230 and a power supply 1244 are coupled to the system-on-chip device 1222. Moreover, in a particular embodiment, as illustrated in FIG. 12, the display device 1228, the input device 1230, the speaker 1236, the microphone 1238, the wireless antenna 1242, the video camera 1272, and the power supply 1244 are external to the system-on-chip device 1222. However, each of the display device 1228, the input device 1230, the speaker 1236, the microphone 1238, the wireless antenna 1242, the camera 1272, and the power supply 1244 can be coupled to a component of the system-on-chip device 1222, such as an interface or a controller.

Figure 13:
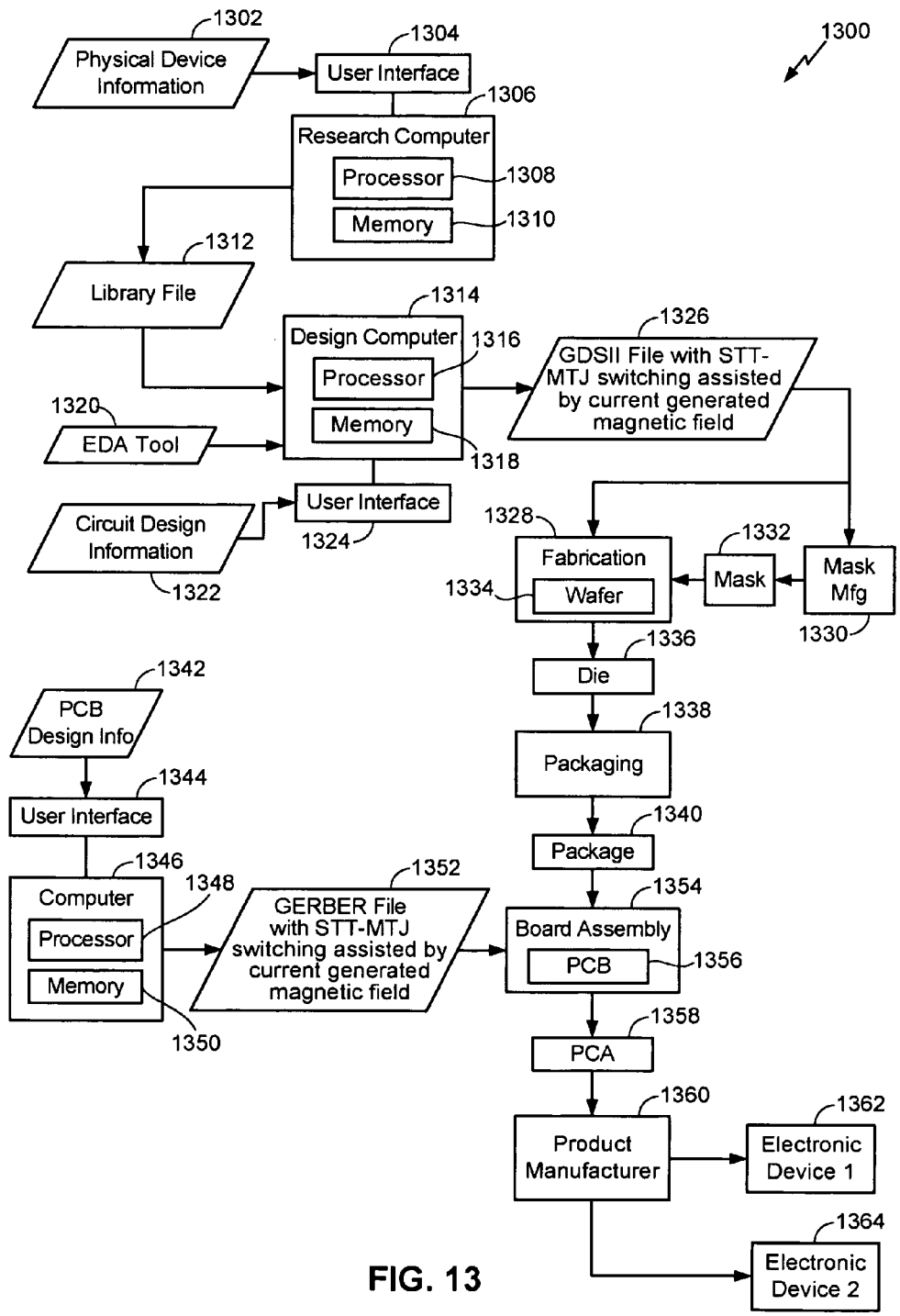
FIG. 13 is a block diagram of a particular embodiment of an electronic device manufacturing system for fabricating an STT-MTJ device.

The devices and functionalities described herein may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 13 depicts a particular illustrative embodiment of an electronic device manufacturing process 1300.

Physical device information 1302 is received in the manufacturing process 1300, such as at a research computer 1306. The physical device information 1302 may include design information representing at least one physical property of a semiconductor device, such as the STT-MRAM of FIG. 1. For example, the physical device information 1302 may include physical parameters, material characteristics, and structure information that is entered via a user interface 1304 coupled to the research computer 1306. The research computer 1306 includes a processor 1308, such as one or more processing cores, coupled to a computer readable medium such as a memory 1310. The memory 1310 may store computer readable instructions that are executable to cause the processor 1308 to transform the physical device information 1302 to comply with a file format and to generate a library file 1312.

In a particular embodiment, the library file 1312 includes at least one data file including the transformed design information. For example, the library file 1312 may include a library of semiconductor devices including the STT-MRAM of FIG. 1.

The library file 1312 may be used in conjunction with an EDA tool 1320 at a design computer 1314 including a processor 1316, such as one or more processing cores, coupled to a memory 1318. The EDA tool 1320 may be stored as processor executable instructions at the memory 1318 to enable a user of the design computer 1314 to design a circuit. For example, a user of the design computer 1314 may enter circuit design information 1322 via a user interface 1324 coupled to the design computer 1314. The circuit design information 1322 may include design information representing at least one physical property of a semiconductor device, such as the STT-MRAM of FIG. 1. To illustrate, the circuit design property may include identification of particular circuits and relationships to other elements in a circuit design, positioning information, feature size information, interconnection information, or other information representing a physical property of a semiconductor device.

The design computer 1314 may be configured to transform the design information, including the circuit design information 1322, to comply with a file format. To illustrate, the file format may include a database binary file format representing planar geometric shapes, text labels, and other information about a circuit layout in a hierarchical format, such as a Graphic Data System (GDSII) file format. The design computer 1314 may be configured to generate a data file including the transformed design information, such as a GDSII file 1326, which includes information describing the STT-MRAM of FIG. 1, in addition to other circuits or information. To illustrate, the data file may include information corresponding to a system-on-chip (SOC) that includes the STT-MRAM of FIG. 1 and that also includes additional electronic circuits and components within the SOC.

The GDSII file 1326 may be received at a fabrication process 1328 to manufacture the STT-MRAM of FIG. 1, according to transformed information in the GDSII file 1326. For example, a device manufacture process may include providing the GDSII file 1326 to a mask manufacturer 1330 to create one or more masks, such as masks to be used for photolithography processing, illustrated as a representative mask 1332. The mask 1332 may be used during the fabrication process to generate one or more wafers 1334, which may be tested and separated into dies, such as a representative die 1336. The die 1336 includes a circuit including the STT-MRAM of FIG. 1.

The die 1336 may be provided to a packaging process 1338 where the die 1336 is incorporated into a representative package 1340. For example, the package 1340 may include the single die 1336 or multiple dies, such as a system-in-package (SiP) arrangement. The package 1340 may be configured to conform to one or more standards or specifications, such as Joint Electron Device Engineering Council (JEDEC) standards.

Information regarding the package 1340 may be distributed to various product designers, such as via a component library stored at a computer 1346. The computer 1346 may include a processor 1348, such as one or more processing cores, coupled to a memory 1350. A printed circuit board (PCB) tool may be stored as processor executable instructions at the memory 1350 to process PCB design information 1342 received from a user of the computer 1346 via a user interface 1344. The PCB design information 1342 may include physical positioning information of a packaged semiconductor device on a circuit board, the packaged semiconductor device corresponding to the package 1340 including the STT-MRAM of FIG. 1, for example.

The computer 1346 may be configured to transform the PCB design information 1342 to generate a data file, such as a GERBER file 1352 with data that includes physical positioning information of a packaged semiconductor device on a circuit board, as well as layout of electrical connections such as traces and vias. In other embodiments, the data file generated by the transformed PCB design information may have a format other than a GERBER format.

The GERBER file 1352 may be received at a board assembly process 1354 and used to create PCBs, such as a representative PCB 1356, manufactured in accordance with the design information stored within the GERBER file 1352. For example, the GERBER file 1352 may be uploaded to one or more machines for performing various steps of a PCB production process. The PCB 1356 may be populated with electronic components including the package 1340 to form a represented printed circuit assembly (PCA) 1358.

The PCA 1358 may be received at a product manufacture process 1360 and integrated into one or more electronic devices, such as a first representative electronic device 1362 and a second representative electronic device 1364. As an illustrative, non-limiting example, the first representative electronic device 1362, the second representative electronic device 1364, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 1362 and 1364 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-13 may illustrate remote units according to the teachings of the disclosure, the disclosure is not limited to these exemplary illustrated units. Embodiments of the disclosure may be suitably employed in any device that includes active integrated circuitry including memory and on-chip circuitry for test and characterization.

Thus, embodiments may be fabricated, processed, and incorporated into an electronic device, as described in the illustrative process 1300. One or more aspects of the embodiments disclosed with respect to FIGS. 1-13 may be included at various processing stages, such as within the library file 1312, the GDSII file 1326, and the GERBER file 1352, as well as stored at the memory 1310 of the research computer 1306, the memory 1318 of the design computer 1314, the memory 1350 of the computer 1346, the memory of one or more other computers or processors (not shown) used at the various stages, such as at the board assembly process 1354, and also incorporated into one or more other physical embodiments such as the mask 1332, the die 1336, the package 1340, the PCA 1358, other products such as prototype circuits or devices (not shown), or any combination thereof. Although various representative stages of production from a physical device design to a final product are depicted, in other embodiments fewer stages may be used or additional stages may be included. Similarly, the process 1300 may be performed by a single entity, or by one or more entities performing various stages of the process 1300.

A number of memory control techniques have been described. The techniques may be implemented in hardware, software, firmware, or any combination thereof. If implemented in software, the techniques may be directed to a computer readable medium comprising program code that when executed in a device causes the device to perform one or more of the techniques described herein. In that case, the computer readable medium may comprise (in addition to MRAM), any random access memory (RAM) such as synchronous dynamic random access memory (SDRAM), read-only memory (ROM), non-volatile random access memory (NVRAM), electrically erasable programmable read-only memory (EEPROM), FLASH memory, or the like.

The program code may be stored in memory in the form of computer readable instructions. In that case, a processor, such as a DSP, may execute instructions stored in memory in order to carry out one or more of the image processing techniques. In some cases, the techniques may be executed by a DSP that invokes various hardware components to accelerate the image processing. In other cases, the units described herein may be implemented as a microprocessor, one or more application specific integrated circuits (ASICs), one or more field programmable gate arrays (FPGAs), or some other hardware-software combination.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. In addition to MRAM, a software module may reside in random access memory (RAM), flash memory, read-only memory (ROM), programmable read-only memory (PROM), erasable programmable read-only memory (EPROM), electrically erasable programmable read-only memory (EEPROM), registers, a hard disk, a removable disk, a compact disk read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising controlling current flow direction for current to be sent over at least one of a source line and a bit line to generate a current-generated magnetic field to assist switching of a direction of a magnetic field of a free layer of a magnetic memory element within a spin transfer torque magnetic tunnel junction (STT-MTJ) device, wherein the bit line or the source line is orthogonal to an easy axis of the STT-MTJ device.

2. The method of claim 1, wherein the direction of the magnetic field of the free layer opposes a direction of another magnetic field incident to the free layer.

3. The method of claim 1, further comprising controlling the current flow direction during a write operation of the STT-MTJ device.

4. The method of claim 3, further comprising applying a continuous current during the write operation.

5. The method of claim 1, further comprising causing the current to flow in the current flow direction through the source line or the bit line to assist with the switching of the direction of the magnetic field of the free layer.

6. The method of claim 1, further comprising selectively applying a voltage to the source line or the bit line.

7. The method of claim 1, further comprising selectively setting the current flow direction to assist with the switching of the direction of the magnetic field of the free layer.

8. The method of claim 1, further comprising regulating a flow of the current to a top electrode and a bottom electrode of the STT-MTJ device.

9. The method of claim 1, wherein the current has a magnitude in a range from about 50 $\mu$A to about 400 $\mu$A.

10. The method of claim 1, wherein the current has a magnitude in a range from about 150 $\mu$A to about 200 $\mu$A.

11. The method of claim 1, wherein the current-generated magnetic field reduces a switching current to switch the direction of the magnetic field of the free layer.

12. The method of claim 1, further comprising sending the current over the bit line during a write operation.

13. The method of claim 1, further comprising controlling a neighboring current flow direction for current sent over one of a source line and a bit line of a neighboring magnetic memory device so that the neighboring current flow direction is parallel to the current flow direction.

14. The method of claim 1, wherein the current flow direction of current to be sent over the source line or the bit line is parallel to a current flow direction of current to be sent over the other of the source line or the bit line.

15. An apparatus comprising:
 a spin transfer torque magnetic tunnel junction (STT-MTJ) device including a free layer associated with a magnetic field;
 a bit line in electronic communication with the STT-MTJ device;
 a source line in electronic communication with the STT-MTJ device; and
 a control logic circuit configured to control a current flow direction for current to be sent over the source line or the bit line to generate a current-generated magnetic field that assists switching of a direction of the magnetic field associated with the free layer of the STT-MTJ device, wherein the bit line or the source line is orthogonal to an easy axis of the free layer.

16. The apparatus of claim 15, wherein the control logic circuit is further configured to adjust a voltage on the bit line or the source line to control the current flow direction.

17. The apparatus of claim 15, further comprising a first electrode coupled to the bit line and a second electrode coupled to the source line.

18. The apparatus of claim 15, further comprising a via coupled to an electrode and coupled to the bit line or the source line.

19. The apparatus of claim 15, wherein an axis of the bit line is orthogonal to an axis of the source line.

20. The apparatus of claim 15, wherein current flows over the bit line and the source line in opposite directions.

21. The apparatus of claim 15, wherein the apparatus comprises one of a wireless device, a magnetic random access memory, a camera, and a camcorder.

22. The apparatus of claim 15, wherein the direction of the magnetic field associated with the free layer of the STT-MTJ device matches a direction of an easy axis of the STT-MTJ.

23. The apparatus of claim 15 integrated in a semiconductor die.

24. A computer readable tangible medium storing instructions executable by a computer, the instructions comprising:
instructions that are executable by the computer to automatically control current flow direction for current to be sent over a source line or a bit line to generate a magnetic field,
wherein the current-generated magnetic field is applied to assist switching of a direction of a magnetic field of a free layer of a magnetic memory element within a spin transfer torque magnetic tunnel junction (STT-MTJ) device, wherein the source line or the bit line is orthogonal to an easy axis of the free layer.

25. The computer readable tangible medium of claim 24, wherein the instructions are executable by a processor integrated in a device selected from the group consisting of a set top box, a music player, a video player, an entertainment unit, a navigation device, a communications device, a personal digital assistant (PDA), a fixed location data unit, and the computer.

26. An apparatus, comprising:
a first current path supporting current flow through a plurality of spin transfer torque magnetic tunnel junction (STT-MTJ) devices in a fixed direction;
a second current path supporting current flow through the plurality of STT-MTJ devices in an opposite direction to the fixed direction;
a bit line in electronic communication with at least one STT-MTJ device of the plurality of the STT-MTJ devices; and
a source line in electronic communication with the at least one STT-MTJ device of the plurality of the STT-MTJ devices, wherein the source line or the bit line is orthogonal to an easy axis of the at least one STT-MTJ device of the plurality of the STT-MTJ devices.

27. The apparatus of claim 26, wherein the first current path is used for switching an STT-MTJ device of the plurality of STT-MTJ devices from an anti-parallel state to a parallel state.

28. The apparatus of claim 27, wherein the second current path is used for switching an STT-MTJ device of the plurality of STT-MTJ devices between a parallel state to an anti-parallel state.

29. The apparatus of claim 26, wherein the plurality of STT-MTJ devices are within a magnetic random access memory.

30. The apparatus of claim 26, wherein the opposite direction is fixed.

31. An apparatus comprising:
spin transfer torque magnetic tunnel junction (STT-MTJ) means for storing data; and
means for controlling current flow direction for current to be sent over a source line or a bit line to generate a current-generated magnetic field to assist switching of a direction of a magnetic field of a free layer of a magnetic element within the STT-MTJ means for storing data, wherein the source line or the bit line is orthogonal to an easy axis of the free layer.

32. The apparatus of claim 31, further comprising a device selected from the group consisting of a set top box, a music player, a video player, an entertainment unit, a navigation device, a communications device, a personal digital assistant (PDA), a fixed location data unit, and a computer, into which the device is integrated.

33. A method comprising:
receiving design information including physical positioning information of a packaged semiconductor device on a circuit board, the packaged semiconductor device including a semiconductor structure comprising:
a spin transfer torque magnetic tunnel junction (STT-MTJ) device including a free layer associated with a magnetic field;
a bit line in electronic communication with the STT-MTJ device;
a source line in electronic communication with the STT-MTJ device; and
a control logic circuit configured to control a current flow direction for current sent to the source line or the bit line to generate a current generated magnetic field to assist switching of a direction of the magnetic field associated with the free layer of the STT-MTJ device, wherein the source line or the bit line is oriented with respect to an easy axis of the STT-MTJ device to result in a current-generated magnetic field that is substantially parallel to the easy axis of the STT-MTJ device; and
transforming the design information to generate a data file.

34. The method of claim 33, wherein the data file has a GERBER format.

35. A method comprising:
a first step for controlling current flow direction for current to be sent over at least one of a source line and a bit line to generate a current-generated magnetic field to assist switching of a direction of a magnetic field of a free layer of a magnetic memory element within a spin transfer torque magnetic tunnel junction (STT-MTJ) device, wherein the source line or the bit line is orthogonal to an easy axis of the free layer; and
a second step for selectively setting the current flow direction to assist with the switching of the direction of the magnetic field of the free layer.

36. The method of claim 35, wherein the first step and the second step are performed by a processor integrated into an electronic device.

37. A method comprising:
receiving a data file comprising design information corresponding to a semiconductor device; and
fabricating the semiconductor device according to the design information, wherein the semiconductor device comprises:
a spin transfer torque magnetic tunnel junction (STT-MTJ) device including a free layer associated with a magnetic field;
a bit line in electronic communication with the STT-MTJ device;

a source line in electronic communication with the STT-MTJ device; and a control logic circuit configured to control a current flow direction for current sent to the source line or the bit line to generate a current generated magnetic field to assist switching of a direction of the magnetic field associated with the free layer of the STT-MTJ device, wherein the source line or the bit line is orthogonal to an easy axis of the free layer.

38. The method of claim 37, wherein the data file has a GDSII format.

39. A method comprising:

receiving a data file comprising design information comprising physical positioning information of a packaged semiconductor device on a circuit board; and manufacturing the circuit board configured to receive the packaged semiconductor device according to the design information, wherein the packaged semiconductor device comprises:

a spin transfer torque magnetic tunnel junction (STT-MTJ) device including a free layer associated with a magnetic field;

a bit line in electronic communication with the STT-MTJ device;

a source line in electronic communication with the STT-MTJ device; and a control logic circuit configured to control a current flow direction for current sent to the source line or the bit line to generate a current generated magnetic field to assist switching of a direction of the magnetic field associated with the free layer of the STT-MTJ device, wherein the source line or the bit line is orthogonal to an easy axis of the free layer.

40. The method of claim 39, wherein the data file has a GERBER format.

41. The method of claim 39, further comprising integrating the circuit board into a device selected from the group consisting of a set top box, a music player, a video player, an entertainment unit, a navigation device, a communications device, a personal digital assistant (PDA), a fixed location data unit, and a computer.

* * * * *